(12) United States Patent
Yang et al.

(10) Patent No.: US 8,796,853 B2
(45) Date of Patent: Aug. 5, 2014

(54) METALLIC CAPPED INTERCONNECT STRUCTURE WITH HIGH ELECTROMIGRATION RESISTANCE AND LOW RESISTIVITY

(75) Inventors: Chih-Chao Yang, Glenmont, NY (US); Chao-Kun Hu, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/404,875

(22) Filed: Feb. 24, 2012

(65) Prior Publication Data

US 2013/0221527 A1 Aug. 29, 2013

(51) Int. Cl.
*H01L 23/522* (2006.01)

(52) U.S. Cl.
USPC .......................................... 257/751

(58) Field of Classification Search
USPC .......... 257/751–753, 757, 758; 438/627, 632, 438/687
See application file for complete search history.

(56) References Cited

U.S. PATENT DOCUMENTS

| | | | |
|---|---|---|---|
| 5,420,073 A | 5/1995 | DiGiacomo et al. | |
| 5,814,557 A | 9/1998 | Venkatraman et al. | |
| 6,057,228 A | 5/2000 | Lee et al. | |
| 6,207,222 B1 | 3/2001 | Chen et al. | |
| 6,323,554 B1 | 11/2001 | Joshi et al. | |
| 6,646,353 B1 | 11/2003 | Lopatin | |
| 6,835,660 B2 | 12/2004 | Usami | |
| 7,064,064 B2 * | 6/2006 | Chen et al. | 438/672 |
| 7,144,805 B2 | 12/2006 | Chen et al. | |
| 7,244,677 B2 | 7/2007 | Ritzdorf et al. | |
| 7,262,505 B2 | 8/2007 | Ahn et al. | |
| 7,378,737 B2 | 5/2008 | Farrar | |
| 7,535,103 B2 | 5/2009 | Farrar | |
| 7,569,475 B2 | 8/2009 | Yang et al. | |
| 7,666,773 B2 | 2/2010 | Huotari et al. | |
| 7,687,877 B2 | 3/2010 | Yang et al. | |
| 7,834,457 B2 | 11/2010 | Yang et al. | |
| 7,871,935 B2 | 1/2011 | Yang et al. | |
| 7,998,864 B2 | 8/2011 | Yang et al. | |
| 8,013,446 B2 | 9/2011 | Yang et al. | |
| 8,241,701 B2 * | 8/2012 | Dordi et al. | 427/98.1 |
| 2005/0227479 A1 | 10/2005 | Feng et al. | |
| 2008/0197499 A1 | 8/2008 | Yang et al. | |
| 2008/0315426 A1 | 12/2008 | Yang et al. | |
| 2009/0039512 A1 | 2/2009 | Yang et al. | |
| 2009/0194875 A1 * | 8/2009 | Yang et al. | 257/751 |
| 2009/0200668 A1 | 8/2009 | Yang et al. | |

(Continued)

OTHER PUBLICATIONS

International Search Report and Written Opinion dated Apr. 5, 2013 received in a corresponding foreign application.
Yang, C.-C., et al., "Characterization of Cu Reflows on Ru", IEEE Electron Device Letters, Oct. 2011, vol. 32, No. 10.

(Continued)

*Primary Examiner* — Matthew W Such
*Assistant Examiner* — Warren H Kilpatrick
(74) *Attorney, Agent, or Firm* — Scully, Scott, Murphy & Presser, P.C.; Louis J. Percello, Esq.

(57) ABSTRACT

An interconnect structure including a metallic cap that covers 80 to 99% of the entire surface of an underlying conductive metal feature is provided utilizing a metal reflow process. Laterally extending portions of the conductive metal feature are located on vertical edges of the metallic cap, and each of the laterally extending portions of the conductive metal feature has an uppermost surface that is coplanar with an uppermost surface of the metallic cap.

15 Claims, 3 Drawing Sheets

(56) References Cited

U.S. PATENT DOCUMENTS

| | | |
|---|---|---|
| 2009/0309226 A1 | 12/2009 | Horak et al. |
| 2010/0038782 A1 | 2/2010 | Yang et al. |
| 2010/0084767 A1 | 4/2010 | Yang et al. |
| 2010/0279459 A1 | 11/2010 | Huang et al. |
| 2010/0330800 A1 | 12/2010 | Ivanov et al. |

OTHER PUBLICATIONS

U.S. Appl. No. 12/187,864, entitled, "Interconnect Structure with Metal Cap Self-Aligned to a Surface of an Embedded Conductive Material", filed Aug. 7, 2008, First Named Inventor: Chih-Chao Yang.

\* cited by examiner

METALLIC CAPPED INTERCONNECT STRUCTURE WITH HIGH ELECTROMIGRATION RESISTANCE AND LOW RESISTIVITY

BACKGROUND

The present disclosure relates to a semiconductor structure and a method of forming the same. More particularly, the present disclosure relates to an interconnect structure including a metallic cap located atop a conductive metal feature of the interconnect structure.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene interconnect structures. The interconnect structure typically includes copper, Cu, or a Cu alloy since Cu-based interconnects provide higher speed signal transmission between large numbers of transistors on a complex semiconductor chip as compared with aluminum, Al,-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") is achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure utilizing plating, chemical vapor deposition or atomic layer deposition. One problem with utilizing such selectively deposited metal caps is that some of the metal cap extends onto the adjoining surface of the interconnect dielectric material and, as such, electrical shorts between adjacent interconnects may arise.

It is also known to provide a metal cap directly on the surface of an interconnect conductive material, such as, for example, Cu, by recessing the interconnect conductive material below a surface of the interconnect dielectric material. Although this prior art process provides a metal cap that is located only on a surface of the recessed conductive material, such a process is problematic since there is high process cost associated therewith.

It is further known to provide a metal cap utilizing a CuMn alloy which is first deposited within an opening of an interconnect dielectric material and then an anneal is performed to migrate the Mn upwards to form a metallic cap that is composed of Mn atop a Cu structure that has a reduced Mn content. This prior art approach can negatively impact the electrical conductivity of the interconnect structure.

SUMMARY

An interconnect structure including a metallic cap that covers 80 to 99% of the entire surface of an underlying conductive metal feature is provided utilizing a metal reflow process. Laterally extending portions of the conductive metal feature are located on vertical edges of the metallic cap, and each of the laterally extending portions of the conductive metal feature has an uppermost surface that is coplanar with an uppermost surface of the metallic cap.

The interconnect structure of the present disclosure provides reduced electromigration (EM) and, as such, EM void growth is also reduced. The aforementioned properties are achieved in the present disclosure without increasing the resistance of the interconnect structure and without utilizing complex processes such as is required in prior art processes. In some embodiments, the interconnect structure of the present disclosure does not exhibit any undesirable line-to-line leakages or capacitance increases.

In one aspect of the present disclosure, an interconnect structure is provided. The interconnect structure includes an interconnect dielectric material having an opening located therein. A diffusion barrier is located on wall surfaces of the interconnect dielectric material within the opening. A conductive metal feature is located on the diffusion barrier and partially fills the opening. A metallic cap is located on a portion of the conductive metal feature within the opening. The conductive metal feature has laterally extending portions that are located on each vertical edge of the metallic cap, and each of the laterally extending portions of the conductive metal feature has an uppermost surface that is coplanar with an uppermost surface of the metallic cap.

In another aspect of the present disclosure, a method of providing an interconnect structure is provided. The method includes providing a structure including an interconnect dielectric material having an opening located therein. A diffusion barrier is then formed on an uppermost surface of the interconnect dielectric material and on wall portions of the interconnect dielectric material within the opening. Next, a contiguous conductive metal liner is formed on the diffusion barrier that is located on the uppermost surface of the interconnect dielectric material and on the wall portions of the interconnect dielectric material within the opening. A reflow anneal is then performed which causes a portion of the contiguous conductive metal liner that is located outside the opening to flow into the opening and to partially fill the opening with a conductive metal. A cavity remains within the opening after the reflow anneal. A metallic layer is formed within the cavity and atop remaining portions of the contiguous conductive metal liner that are located atop the diffusion barrier that is located outside the opening and on the uppermost surface of the interconnect dielectric material. A portion of the metallic layer, remaining portions of the contiguous conductive metal liner, and a portion of the diffusion barrier that are located outside of the opening are then removed to provide a metallic cap located on a portion of a conductive metal feature within the opening. The conductive metal feature that is provided has laterally extending portions located on each vertical edge of the metallic cap, and each of the laterally extending portions of the conductive metal feature has an uppermost surface that is coplanar with an uppermost surface of the metallic cap.

DETAILED DESCRIPTION

Figure 1:
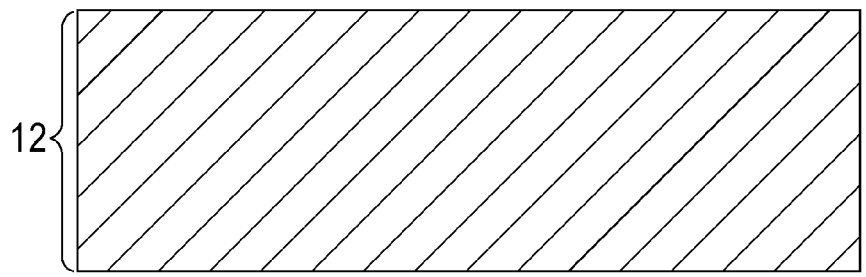
FIG. 1 is a pictorial representation (through a cross sectional view) depicting an initial structure including an interconnect dielectric material that can be employed in one embodiment of the present disclosure.

The present disclosure will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

The present disclosure provides an interconnect structure including a metallic cap that covers 80 to 99% of the entire surface of an underlying conductive metal feature. The interconnect structure of the present disclosure is provided utilizing a metal reflow process and thus represents a simpler technique for forming a metallic capped interconnect structure as compared to prior art processes. The interconnect structure of the present disclosure includes laterally extending portions of the conductive metal feature located on vertical edges of the metallic cap, and each of the laterally extending portions of the conductive metal feature has an uppermost surface that is coplanar with an uppermost surface of the metallic cap. The interconnect structure of the present disclosure provides reduced electromigration (EM) and, as such, EM void growth is also reduced. The aforementioned properties are achieved in the present disclosure without increasing the resistance of the interconnect structure and without utilizing complex processes such as is required in prior art processes for forming metallic capped interconnect structures. In some embodiments, the interconnect structure of the present disclosure does not exhibit any undesirable line-to-line leakages or capacitance increases.

Reference is now made to FIGS. 1-7 which illustrate the basic processing steps that can be used in forming the semiconductor structure, i.e., interconnect structure, of the present disclosure. In the processing steps of the present disclosure no recess etch is employed to provide the metallic capped interconnect structure. Instead, a metal reflow anneal is used to partially fill an opening in an interconnect dielectric material with a conductive metal. The conductive metal that partially fills the opening has portions that extend upwards and out of the opening. A cavity is present atop and laterally adjacent to the portions of the conductive metal that extend upwards and out of the opening. A metallic layer is then formed filling the cavity. The metallic layer does not need to be formed utilizing a selective deposition process as required in some of the prior art processes for providing a metallic capped interconnect structure. A planarization step, which represents the sole planarization process used in the present disclosure, is then used to form the interconnect structure of the present disclosure.

FIG. 1 illustrates an initial structure 10 that comprises an interconnect dielectric material 12.

Interconnect dielectric material 12 may be located upon a substrate (not shown in the drawings of the present application). The substrate, which is not shown, may comprise a semiconducting material, an insulating material, a conductive material or any combination thereof. When the substrate is comprised of a semiconducting material, any semiconducting material such as Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The interconnect dielectric material 12 can include any interlevel or intralevel dielectric including inorganic dielectrics or organic dielectrics. In one embodiment, the interconnect dielectric material 12 may be non-porous. In another embodiment, the interconnect dielectric material 12 may be porous. Porous dielectrics are advantageous since such dielectric materials have lower dielectric constants than an equivalent non-porous dielectric material. Some examples of suitable dielectrics that can be used as the interconnect dielectric material 12 include, but are not limited to: $SiO_2$, silsesquioxanes, C doped oxides (i.e., organosilicates) that include atoms of Si, C, O and H, thermosetting polyarylene ethers, or multilayers thereof. When a multilayered interconnect dielectric material structure is employed, the various dielectric material layers are typically in direct contact with each other. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the interconnect dielectric material 12 has a dielectric constant that is about 4.0 or less. In another embodiment, the interconnect dielectric material 12 has a dielectric constant of about 2.8 or less. All dielectric constants mentioned herein are relative to a vacuum, unless otherwise noted. The interconnect dielectric material 12 that is employed in the present disclosure generally has a lower parasitic crosstalk as compared with dielectric materials that have a dielectric constant of greater than 4.0. The thickness of the interconnect dielectric material 12 may vary depending upon the dielectric material used as well as the exact number of dielectrics layers within the interconnect dielectric material 12. Typically, and for normal interconnect structures, the interconnect dielectric material 12 has a thickness from about 50 nm to about 1000 nm.

Figure 2:
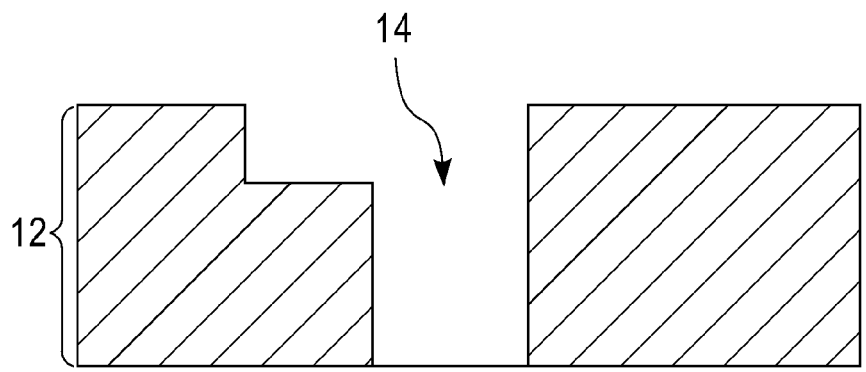
FIG. 2 is a pictorial representation (through a cross sectional view) depicting the initial structure of FIG. 1 after forming an opening within the interconnect dielectric material.

Referring now to FIG. 2, there is shown the initial structure 10 of FIG. 1 after forming an opening 14 into the interconnect dielectric material 12. Although a single opening 14 is shown in the drawings, a plurality of such openings can be formed. When a plurality of openings are formed, each opening can have a same or a different depth. In some embodiments, the bottommost surface of the opening does not extend entirely through the interconnect dielectric material 12. In other embodiments, and as shown in FIG. 2, the opening 14 extends entirely through the interconnect dielectric material 12. Also, and when a plurality of openings are formed, each opening 14 can be of a same type or of a different type.

The opening 14 can be formed into the interconnect dielectric material 12 utilizing lithography and etching. The lithographic process can include forming a photoresist (not shown) atop the interconnect dielectric material 12, exposing the photoresist to a desired pattern of radiation and developing the exposed photoresist utilizing a conventional resist developer. The pattern is then transferred into the underlying interconnect dielectric material 12 by etching. The etching can include a dry etching process (such as, for example, reactive ion etching, ion beam etching, plasma etching or laser ablation), and/or a wet chemical etching process. Typically, reactive ion etching is used in providing opening 14. After patterning the underlying interconnect dielectric material 12, the patterned photoresist can be removed utilizing a conventional stripping process such as, for example, ashing.

In one embodiment and prior to patterning the interconnect dielectric material 12, a hard mask (not shown) can be formed directly on an uppermost surface of the interconnect dielectric material 12. When employed, the hard mask can include an oxide, a nitride, an oxynitride or any multilayered combination thereof. In one embodiment, the hard mask is an oxide such as silicon dioxide, while in another embodiment the hard mask is a nitride such as silicon nitride. The hard mask can be formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask can be formed by one of thermal oxidation, and thermal nitridation.

When employed, the thickness of the hard mask is from 5 nm to 100 nm. Other thicknesses that are greater than or lesser than the thickness range mentioned above can also be employed for the hard mask. When a hard mask is present, a first etch is performed to transfer the pattern provided in the photoresist to the hard mask, the patterned photoresist is then removed by an ashing step, and thereafter, a second etch is performed to transfer the pattern from the patterned hard mask into the underlying interconnect dielectric material 12. In embodiments in which a hard mask is present, the hard mask can be removed from atop the interconnect dielectric material 12 after the opening 14 is formed therein.

The opening 14 that is formed into the interconnect dielectric material 12 can be a via opening, a line opening, and/or combined via/line opening. In FIG. 2, and by way of an example, a combined via and line opening is shown. The individual via opening and line opening of the combined via and line opening are in communication with each other. When a combined via and line opening is formed, a second iteration of lithography and etching can be used in forming the same. A via opening can be distinguished from a line opening, in that a via opening has a width that is less than a width of the line opening.

The width of each opening may vary depending on the type of opening formed and should be sufficiently small so as to allow partial filling of the opening by a metal reflow process. For both via and line openings, the width of the opening can be from 10 nm to 200 nm.

Figure 3:
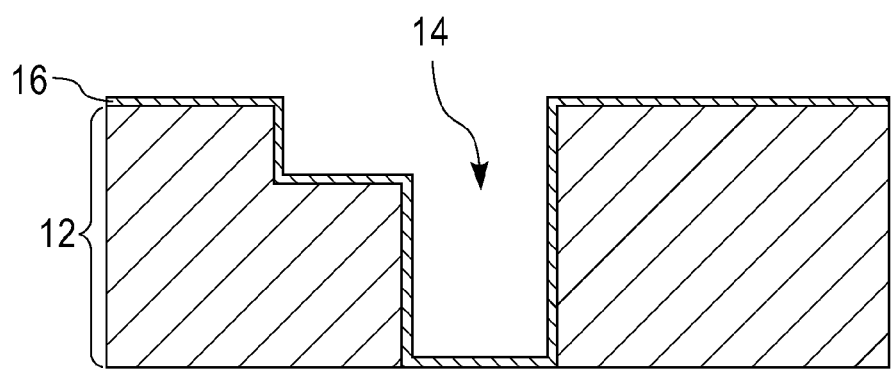
FIG. 3 is a pictorial representation (through a cross sectional view) depicting the structure of FIG. 2 after forming a diffusion barrier (i.e., liner) on exposed surfaces of the interconnect dielectric material including exposed surfaces of the interconnect dielectric material within the opening.

Referring now to FIG. 3, there is illustrated the structure of FIG. 2 after forming a diffusion barrier 16 on all exposed surfaces of the structure including within the opening 14 (i.e., on sidewalls and the bottom wall of the opening) and along the uppermost surface of interconnect dielectric material 12. Diffusion barrier 16 can also be referred to as a liner which is contiguously present in the structure. The terms "contiguously" or "contiguous" denotes that the material liner or layer does not include any breaks therein.

The diffusion barrier 16 includes Co, Ir, Pt, Pd, Ta, TaN, Ti, TiN, Ru, RuN, RuTa, RuTaN, W, WN or any other material that can serve as a barrier to prevent a conductive material from diffusing there through. The thickness of the diffusion barrier 16 may vary depending on the deposition process used as well as the material employed. In one embodiment, the diffusion barrier 16 has a thickness from 2 nm to 50 nm. In another embodiment, the diffusion barrier 16 has a thickness from 5 nm to 20 nm.

The diffusion barrier 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

Figure 4:
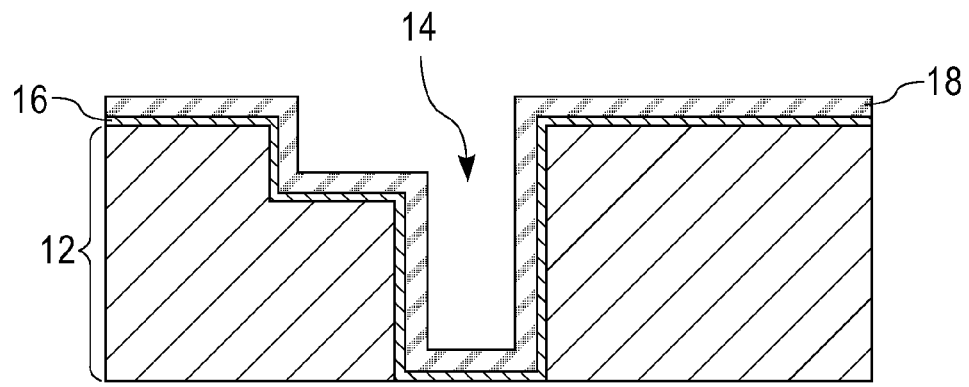
FIG. 4 is a pictorial representation (through a cross sectional view) depicting the structure of FIG. 3 after formation of a contiguous conductive metal liner on the diffusion barrier.

Referring now to FIG. 4, there is illustrated the structure of FIG. 3 after forming a contiguous conductive metal liner 18 on all exposed surfaces of the structures. As shown, a first portion of the contiguous conductive metal liner 18 is located on the diffusion barrier 16 that is located outside the opening 14 and on the uppermost surface of the interconnect dielectric material 12, while a second portion of the contiguous conductive metal liner 18 is located within the opening 14.

The contiguous conductive metal liner 18 can include an elemental metal, an alloy comprising at least two elemental metals, a conductive metal silicide or combinations thereof. In one embodiment, the contiguous conductive metal liner 18 is a conductive metal such as Cu, W or Al. In another embodiment, the contiguous conductive metal liner 18 is comprised of a Cu alloy (such as AlCu or CuMn).

The contiguous conductive metal liner 18 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

The contiguous conductive metal liner 18 that is formed at this point of the present disclosure must be thick enough such that during a subsequent reflow anneal the opening 14 is partially filled with a conductive metal. It is noted that the conductive metal comprises the conductive material of the contiguous conductive metal liner 18 which was subjected to the reflow anneal. In one embodiment, the contiguous conductive metal liner 18 has a thickness from 2 nm to 80 nm. In another embodiment, the contiguous conductive metal liner 18 has a thickness from 4 nm to 50 nm.

Figure 5:
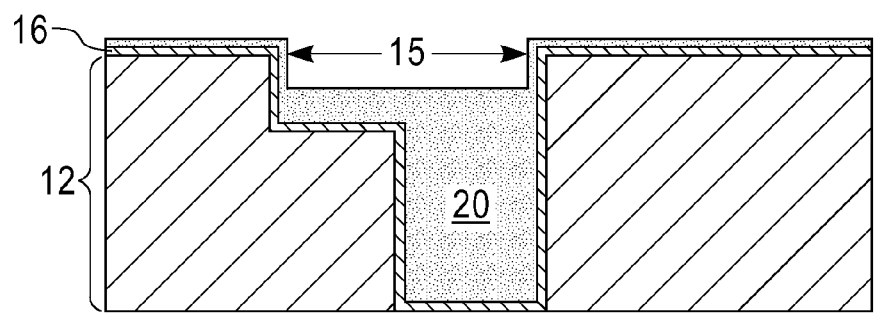
FIG. 5 is a pictorial representation (through a cross sectional view) depicting the structure of FIG. 4 after performing a reflow anneal.

Referring now to FIG. 5, there is illustrated the structure of FIG. 4 after performing a reflow anneal. During the reflow anneal, a portion of the contiguous conductive liner 18 that is located outside the opening 14 flows into the opening 14 filling at least a portion of the opening 14 with conductive metal 20. A cavity 15 remains in the opening 14 which does not extend the entire width and height of the opening 14. As shown in FIG. 5, a portion of the conductive metal 20 remains outside of the opening 14. As also shown in FIG. 5, the portion of the conductive metal 20 that is located outside the opening 14 is in direct physically contact with the conductive metal 20 that is formed within the opening 14. It is again noted that the conductive metal 20 comprises the conductive material of the contiguous conductive metal liner 18 which was subjected to the reflow anneal.

In one embodiment, the reflow anneal can be performed at a temperature from 150° C. to 400° C. for a time period from 5 minutes to 500 minutes. In another embodiment, the reflow anneal can be performed at a temperature from 200° C. to 300° C. for a time period from 20 minutes to 100 minutes. The reflow anneal is performed in a hydrogen-containing ambient. By "hydrogen-containing ambient" it is meant an environment that includes hydrogen. Without wishing to be bound by any theory, it is believed that the during the reflow anneal, the surface energy of the structure is reduced in such a manner that a majority, but not all, of the contiguous conductive metal liner 18 that is located outside the opening 14, i.e., on the field region of the structure, flows into the small features of the opening 14, and partially fills the opening 14 with a conductive metal 20.

Figure 6:
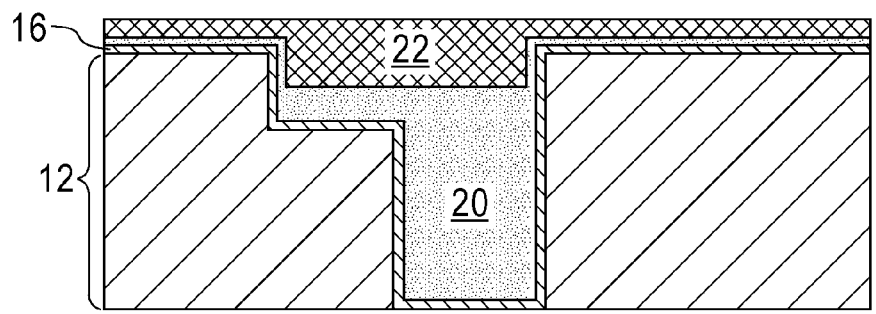
FIG. 6 is a pictorial representation (through a cross sectional view) depicting the structure of FIG. 5 after formation of a metallic layer.

Referring now to FIG. 6, there is illustrated the structure of FIG. 5 after forming a metallic layer 22 on all exposed surfaces of the conductive metal 20. As shown in FIG. 6, a portion of metallic layer 22 fills the cavity 15 that remained within the opening 14, while another portion of the metallic layer 22 is located outside the cavity 15.

The metallic layer 22 comprises a conductive metal that is more resistant to corrosion and oxidation as compared to that of the underlying conductive metal 20. In one embodiment of the present disclosure, the metallic layer 22 comprises Ta, Ru, Ir, Rh, Pt, Co, Ti, Mn, Al or alloys thereof. In another embodiment, the metallic layer 22 is comprised of Co or a Co alloy. In some embodiments, the metallic layer 22 is comprised of single layered material. In other embodiments, the metallic layer 22 is comprised of a multilayered stack.

In one embodiment, the metallic layer 22 that is formed at this point of the present disclosure has a thickness from 2 nm to 100 nm. In another embodiment, the metallic layer 22 has a thickness from 10 nm to 50 nm.

The metallic layer 22 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

In some embodiments of the present disclosure, the formation of the diffusion barrier 16, contiguous conductive metal liner 18, reflow anneal, and the metallic layer 22 occurs without breaking a vacuum between the various processes. In another embodiment, the formation of the diffusion barrier 16, contiguous conductive metal liner 18, reflow anneal, and the metallic layer 22 can occur by breaking a vacuum between at least one of the various processes.

Figure 7:
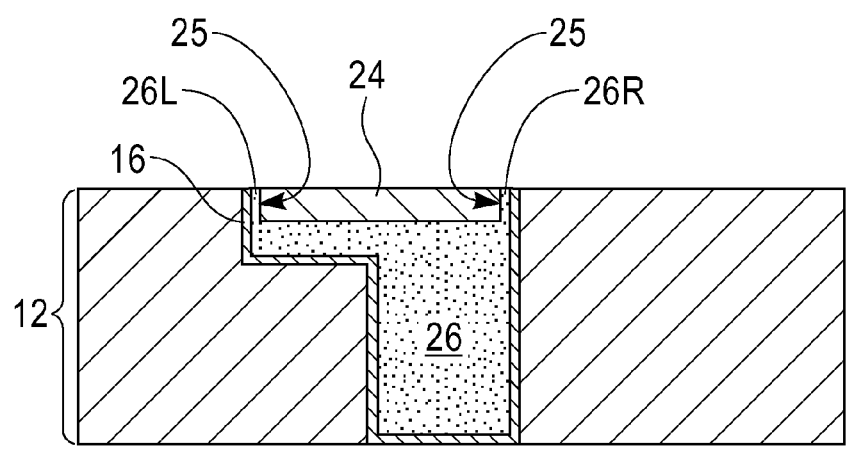
FIG. 7 is a pictorial representation (through a cross sectional view) depicting the structure of FIG. 6 after planarization.

Referring now to FIG. 7, there is illustrated the structure of FIG. 6 after performing a planarization process. The planarization process which can be employed in the present disclosure includes, for example, chemical mechanical polishing (CMP) and/or grinding. The planarization process removes a portion of the metallic layer 22, a portion of the conductive metal 20 and a portion of the diffusion barrier 16 from atop the uppermost surface of the interconnect dielectric material 12. The remainder portion of the metallic layer that is not removed from the structure is referred to as metallic cap 24. The remainder portion of the conductive metal 20 that is not removed from the structure is referred to herein as a conductive metal feature 26. As such, the planarization process provides metallic cap 24 which covers 80 to 99% of the entire surface of the underlying conductive metal feature 26.

As shown in FIG. 7, the conductive metal feature 26 includes laterally extending portions 26L, 26R. Each laterally extending portion 26L or 26R of the conductive metal feature 26 is located on a vertical edge 25 of the metallic cap 24 and is located between the metallic cap 24, and an upper portion of the diffusion barrier 16. Also, and as shown in FIG. 7, each of the laterally extending portions 26L, 26R of the conductive metal feature 26 has an uppermost surface that is coplanar with an uppermost surface of the metallic cap 24. The uppermost surfaces of the metallic cap 24, and each laterally extending portion 26L, 26R of the conductive metal feature 26 are coplanar with the uppermost surface of the interconnect dielectric material 12.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an interconnect structure comprising:

providing a structure including an interconnect dielectric material having an opening located therein;

forming a diffusion barrier on an uppermost surface of the interconnect dielectric material and on wall portions of the interconnect dielectric material within said opening;

forming a contiguous conductive metal liner on said diffusion barrier that is located on the uppermost surface of the interconnect dielectric material and on the wall portions of the interconnect dielectric material within said opening;

performing a reflow anneal, wherein said reflow anneal partially fills said opening with a conductive metal that comprises a reflown portion of said contiguous metal liner, wherein a cavity that does not extend an entire width and height of said opening is provided within said opening by said reflow anneal;

forming a metallic layer containing at least one metal selected from the group consisting of Ru, Ir, Rh, Pt, Co, Mn, and Al and that is more resistant to corrosion and oxidation than that of the conductive metal within said cavity and atop remaining portions of the contiguous conductive metal liner that are located atop the diffusion barrier that is located outside the opening and on the uppermost surface of the interconnect dielectric material; and removing a portion of the metallic layer, said remaining portions of the contiguous conductive metal liner, and a portion of said diffusion barrier that are located outside of said opening to provide a metallic cap containing a remaining portion of said metallic layer located within said cavity and on a portion of a conductive metal feature containing a remaining portion of said conductive metal within said opening, wherein said conductive metal feature has laterally extending portions located on, and in direct physical contact with, each vertical edge of the metallic cap, and each of the laterally extending portions of the conductive metal feature has an uppermost surface that is coplanar with an uppermost surface of the metallic cap, and wherein said metallic cap is separated from sidewalls of said interconnect dielectric material by an upper portion of a remaining portion of the diffusion barrier and said laterally extending portions of said conductive metal feature.

2. The method of claim 1, wherein each laterally extending portion of the conductive metal feature is positioned between one vertical edge of said metallic cap and an upper portion of a remaining portion of said diffusion barrier.

3. The method of claim 1, wherein the uppermost surface of each laterally extending portion of the conductive metal feature and the uppermost surface of the metallic cap are coplanar with an uppermost surface of the interconnect dielectric material.

4. The method of claim 1, wherein said metallic cap covers from 80 to 99% of the conductive metal feature.

5. The method of claim 1, wherein said reflow anneal is performed in a hydrogen-containing ambient at a temperature of 150° C. to 400° C. for a time period from 5 minutes to 500 minutes.

6. The method of claim 1, wherein said reflow anneal is performed in a hydrogen-containing ambient at a temperature from 200° C. to 300° C. for a time period from 20 minutes to 100 minutes.

7. The method of claim 1, wherein said after said reflow anneal a remaining portion of the contiguous conductive metal liner remains outside the opening and atop the uppermost surface of the interconnect dielectric material, said remaining portion of the contiguous conductive metal liner is in direct physical contact with said conductive metal within said opening.

8. The method of claim 1, wherein said opening extends entirely through the interconnect dielectric material.

9. The method of claim 1, wherein said opening extends partially into said interconnect dielectric material.

10. The method of claim 1, wherein said opening is provided utilizing at least one iteration of lithography and etching.

11. The method of claim 1, wherein a vacuum is maintained between each of said forming the diffusion barrier, forming the contiguous conductive metal liner, said reflow annealing, and said forming the metallic layer.

12. The method of claim 1, wherein a vacuum is broken between said forming the diffusion barrier and forming the contiguous conductive metal liner, or between said forming the contiguous conductive metal liner and said reflow annealing, or between said reflow annealing and said forming the metallic layer.

13. The method of claim 1, wherein said removing said portion of the metallic layer, said remaining portions of the contiguous conductive metal liner, and said portion of the diffusion barrier that are located outside of said opening is performed by planarization.

14. The method of claim 1, wherein said conductive metal comprises the contiguous conductive metal liner that is subjected to said reflow anneal.

15. The method of claim 1, wherein said metallic layer contains at least one metal selected from the group consisting of Co.

* * * * *